United States Patent [19]

Kitano

[11] Patent Number: 5,665,646

[45] Date of Patent: Sep. 9, 1997

[54] METHOD FOR MANUFACTURING SEMICONDUCTOR DEVICE WITH LOW ELECTRIC RESISTANCE SILICIDE LAYER ON SILICON SURFACE

[75] Inventor: Tomohisa Kitano, Tokyo, Japan

[73] Assignee: NEC Corporation, Japan

[21] Appl. No.: 399,361

[22] Filed: Mar. 6, 1995

[30] Foreign Application Priority Data

Mar. 7, 1994 [JP] Japan ................................. 6-035812

[51] Int. Cl.[6] ................................................ H01L 21/28
[52] U.S. Cl. ........................ 438/592; 438/659; 438/660; 438/664; 438/682; 438/683
[58] Field of Search ........................ 437/200, 24, 201, 437/192

[56] References Cited

U.S. PATENT DOCUMENTS

| | | | |
|---|---|---|---|
| 4,180,596 | 12/1979 | Crowder et al. | 437/201 |
| 4,774,201 | 9/1988 | Woo et al. | 437/200 |
| 5,302,552 | 4/1994 | Duchateau et al. | 437/200 |

OTHER PUBLICATIONS

S. Wolf "Silicon Processing for the VLSI Era, vol. 2", Lattice Press, pp. 144–146, 1990.

Zirinsky et al. "Oxidation Mechanisms in WSi$_2$ thin Films," Appl. Phys. Lett., vol. 33, No. 1, 1 Jul. 1988, pp. 76–78.

*Primary Examiner*—John Niebling
*Assistant Examiner*—Thomas G. Bilodeau
*Attorney, Agent, or Firm*—Hayes, Soloway, Hennessey, Grossman & Hage, P.C.

[57] ABSTRACT

In order to retrain from rising a temperature of a phase transition for a silicide of refractory metal, such as Ti, Co, Pt, Ni, Mo, W, Ta, or the like, a method for manufacturing a semiconductor device has a process of forming a low electric resistance layer on a surface of a silicon. The process comprises a step of forming, on the surface of the silicon, a layer of silicide of refractory metal with phase transition nuclei therein. The process further comprises a step of subjecting the silicide to phase transition by a phase transition heat treatment at a predetermined transition temperature to convert the silicide layer into a crystalline phase which has low electric resistance. Thereby the low electric resistance layer is formed. Preferably, the silicide of refractory metal with phase transition nuclei is amorphous or the silicide of refractory metal with phase transition nuclei is crystalline but has damages.

26 Claims, 5 Drawing Sheets

METHOD FOR MANUFACTURING SEMICONDUCTOR DEVICE WITH LOW ELECTRIC RESISTANCE SILICIDE LAYER ON SILICON SURFACE

BACKGROUND OF THE INVENTION

The present invention relates to a method for manufacturing a metal-oxide semiconductor device, which will be called a MOS device hereinafter, and, in particular, to a method for manufacturing the device where low resistant silicide layers of refractory metal overlie domains of diffusion layers and gate electrodes of polycrystalline silicon layers, which will be called polysilicon layers hereinafter.

A typical MOS device is a complementary MO device which is provided with a P-type MOS transistor and a N-type MOS transistor in one silicon substrate. The complementary MOS device will be called a CMOS device, hereinafter.

Recent high integration rate of the CMOS device makes a depth of junction between the source and the drain be shallow to thereby increase resistivity of impurity diffusion layers in the device. This makes is difficult to produce high-speed operation semiconductor devices. In order to resolve the problem, the, so-called, "SALISIDE TECHNIQUE" has been used to form silicide films of refractory metal, such as Ti, Ni, Pt, Co, Mo, W, and Ta in self-alignment on the diffusion layers and on the gate electrode of polysilicon.

In detail, after forming polysilicon gate electrode layers and the impurity diffusion layers on a silicon substrate in production of CMOS devices, a layer of the refractory metal, for example, a titanium film is formed on the entire surface of the substrate to overlie the polysilicon layers and the impurity diffusion layers. Then, a first heat treatment is performed to convert the titanium film into a titanium silicide film by reaction of silicon and titanium. The titanium silicide is a type of C49 phase. Then, the titanium silicide film is partially removed by etching to retain titanium silicide layers on the impurity diffusion layers and the polysilicon gate electrodes. Thereafter, a second heat treatment is performed to convert the C49 phase titanium silicide layers into titanium silicide layers of a C54 phase which exhibits lower resistance than C49 phase. Thus, the diffusion layers and gate electrodes are made with low resistances and therefore, CMOS devices can be produced with excellent properties. The crystal structure of the C49 phase is base-centered orthorhombic, but the crystal structure of C54 phase is face-centered orthorhombic. The second heat treatment is performed at a temperature higher than the first heat treatment.

The conventional method has a problem that the temperature in the second heat-treatment, that is, a phase transition temperature rises in accordance with a decrease in thickness of the titanium silicide (TiSi$_2$) layers. This is described in a report by J. Appl. Phys. 71 (9), 1 May 1992, p.p. 4269–4276.

JP-A-1 179415 proposes a modified method of the SALISIDE TECHNIQUE for forming the low resistance silicide layers on the diffusion layers and gate electrodes. In the modified method, after forming the titanium film on the substrate, silicon ions are implanted into diffusion layers through the titanium film by the implantation-through-metal-method to convert the diffusion layers into the amorphous phase. Then, the titanium film of C49 phase is converted into titanium silicide film by lamp annealing. Then, the titanium silicide is partially removed by etching technic to remain titanium silicide layers on the diffusion layers and gate electrodes. Thereafter, the titanium silicide layers are converted from C49 phase into C54 phase by a heat treatment. The modified method is silent as regards suppression of rise of the phase transition temperature.

SUMMARY OF THE INVENTION

Accordingly, it is a general object of the present invention to provide a method for manufacturing a semiconductor device which permits a low resistant layer of a silicide of refractory metal to be easily formed onto a silicon layer with low cost.

It is more specific object of this invention to provide a method for manufacturing a semiconductor device which has low resistance layers of TiSi$_2$ of a C54 phase on the diffusion layers and gate electrodes by suppressing the phase transition temperature of TiSi$_2$ layers from C49 phase to C54 phase so as to be comparatively low and without agglomeration of TiSi$_2$ grains.

According to one aspect of the present invention, there is provided a method for manufacturing a semiconductor device having a process of forming a low electric resistance layer on a surface of a silicon layer. In this invention, the process comprises steps of forming, on the surface of the silicon layer, a layer of silicide of refractory metal with phase transition nuclei therein and subjecting the silicide to phase transition by a phase transition heat treatment at a predetermined transition temperature to convert the silicide layer into a crystalline phase having low electric resistance to thereby form the low electric resistance layer.

The refractory metal is typically at least one element selected from a group of Ti, Co, Pt, Ni, Mo, W and Ta.

According to one aspect, the silicide of refractory metal with phase transition nuclei is amorphous. In case, the predetermined reaction temperature is selected to be 400° C. or less so as to predetermine generation of C49 phase of the silicide. On the other hand, the predetermined reaction temperature is selected to be 200° C. or more so as to produce the amorphous silicide.

Further, the predetermined transition temperature can be selected to be 900° C. or less to obtain the silicide of dC54 phase. But the predetermined transition temperature is preferably 800° C. or more.

In order to form amorphous silicide layer, the step of forming the layer of silicide of refractory metal can comprise sub-steps of, depositing a film of the refractory metal on the surface of silicon, subjecting the deposited film to a chemical reaction heat treatment at a predetermined reaction temperature for a predetermined time to convert the film into the layer of amorphous silicide of refractory metal. The predetermined reaction temperature is lower than the predetermined transition temperature. Then, etching is carried out to remove an upper excessive portion of the amorphous silicide layer. The excessive portion comprises the excess refractory metal and titanium nitride.

Alternatively, the amorphous silicide layer can be directly deposited on the surface of silicon.

In another aspect of the present invention, the silicide of refractory metal with phase transition nuclei is crystalline but has damages.

In order to form the silicide having damages, the step of forming the layer of silicide of refractory metal comprises sub-steps of, depositing a film of the refractory metal on the surface of silicon, and subjecting the deposited film to a chemical reaction heat treatment at a predetermined reaction temperature for a predetermined time to convert the film into the layer of silicide of refractory metal. The predetermined reaction temperature is lower than the predetermined transition temperature. The predetermined reaction temperature is selected to be 400° C. at minimum but 750° C. at maximum. Then, etching is carried out to remove an upper excessive portion of the amorphous silicide layer. The excessive portion comprises the excess refractory metal and titanium nitride. Thereafter, ions are implanted into the reacted silicide layer after being etched to form the crystalline silicide having the damages.

DESCRIPTION OF PREFERRED EMBODIMENTS

For a better understanding of this invention, a description will first be made as regards a known method of manufacturing a semiconductor device, in particular, a method of forming a titanium silicide of a low resistance on a silicon surface will be mainly described by use of the conventional SALISIDE TECHNIQUE with reference to FIGS. 1 to 7 as follows.

Figure 1:
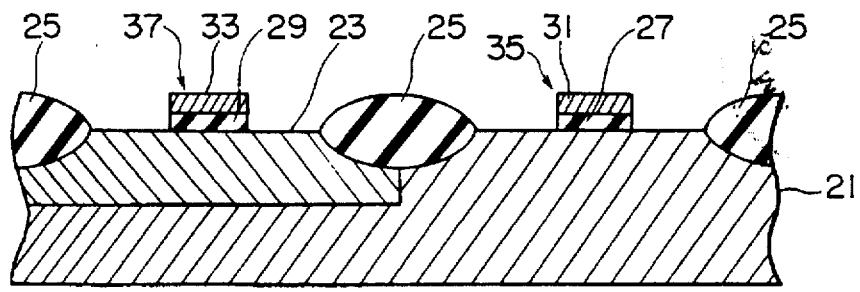
FIGS. 1 to 6 are cross-sectional views for use in explanation of a known method of manufacturing a semiconductor device.

Referring to FIG. 1, in manufacturing the CMOS semiconductor device of an N-well type, a P-type silicon substrate 21 is prepared and an N-well 23 is formed in the P-type silicon substrate 21 by diffusion of donor in a preselected surface region of the substrate. Then, isolation layers or field oxide film portions 25 are formed on surface regions including boundaries between the P-type region of the silicon substrate 21 and the N-well 23. That is, P-channel and N-channel domains are defined between the field oxide film portions 25, respectively. On the P-channel and N-channel domains, gate oxide films 27 and 29 are formed, respectively, on which polysilicon layers 31 and 33 are, in turn, formed as gate electrodes, respectively.

Figure 2:
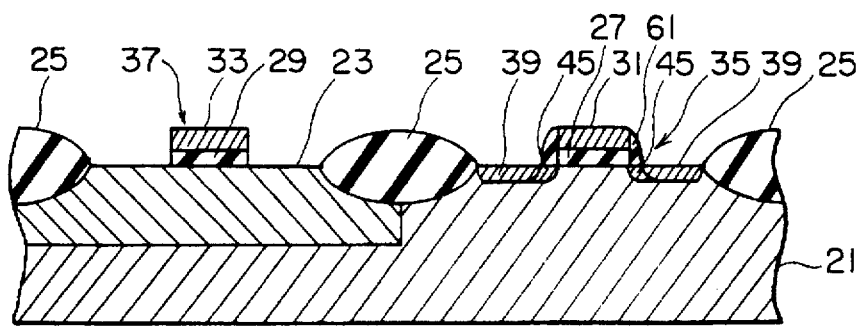

Then, by use of masking techniques, N-type impurity, such as arsenic ion, is implanted in the both surface regions of the gate structure 35 to form N-channel diffusion domains 39 as shown in FIG. 2. Thus, the N-channel is formed under the gate 35.

In the shown example, spacers 61 are formed on both sides of the polysilicon layer 31 and gate oxide film 27 by use of the RIE (Reactive Ion Etching techniques), and lightly doped drain (LDD) regions are formed in the vicinity of the N-channel, as shown at 45. Thus, the so called LDD structure is formed.

Figure 3:
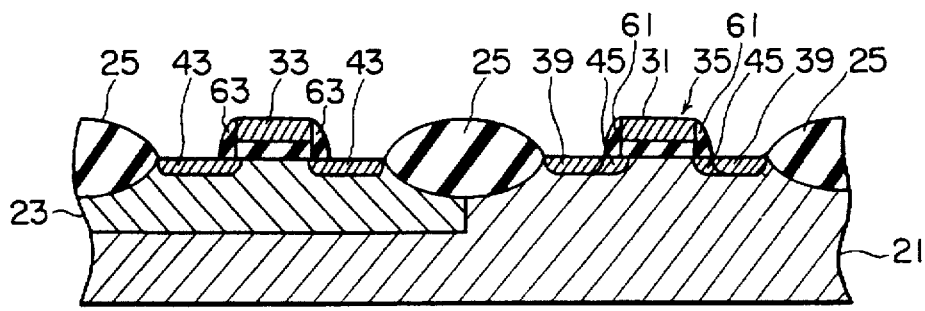

Referring to FIG. 3, by use of masking technique, P-type impurity, such as boron ion, is implanted in the both surface regions of the other gate structure 37 to form P-channel diffusion domains 43. Thus, the P-channel is formed under the gate 37. A pair of silicon dioxide side films 63 are also formed on both sides of gate 37.

Figure 4:
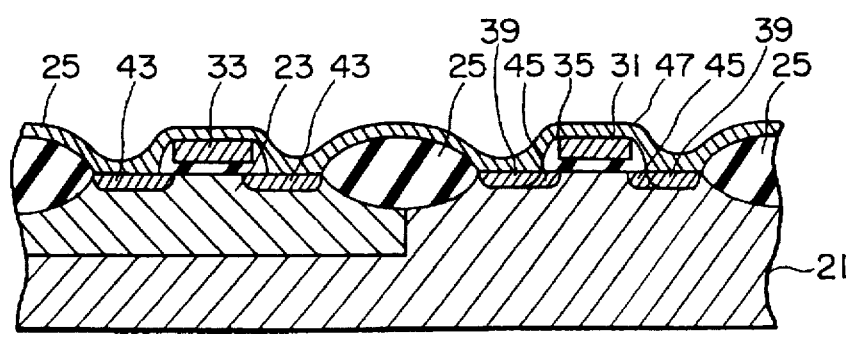

Thereafter, as shown in FIG. 4, a titanium film 47 as a refractory metal is deposited by a sputtering process onto the entire surface defined by the field oxide film portions 25, the P-channel and N-channel diffusion domains 39 and 43 and the gate electrodes 35 and 37. Then, a heat treatment is performed in nitrogen atmosphere at about 700° C. to react the titanium with silicon of the N-channel diffusion domains 39, the P-channel diffusion domains 43, and the polysilicon layers 31 and 33. Thus, titanium silicide ($TiSi_2$) of C49 phase is formed on the N-channel diffusion domains 39, the P-channel diffusion domains 43, and the polysilicon layers 31 and 33.

Figure 5:
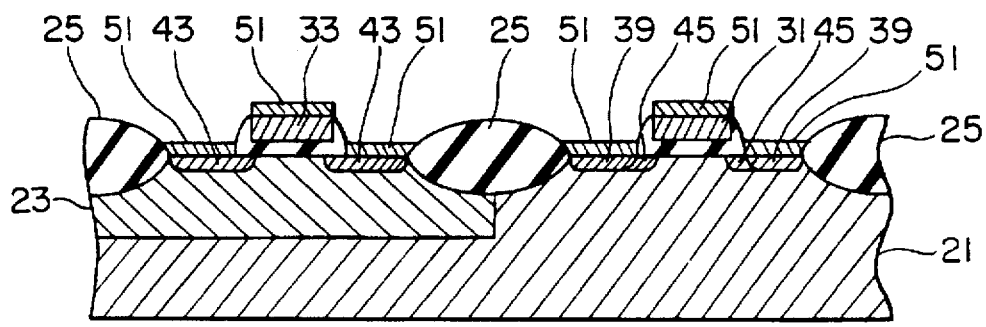

Thereafter, referring to FIG. 5, an etching process is carried out by use of ammonium hydrogen peroxide to remove non-reacted titanium which is on silicon dioxide films 25, 61 and 63, and titanium nitride which is inevitably produced by the reaction in the nitrogen atmosphere. Thereafter, a phase transition heat treatment is carried out to convert $TiSi_2$ from C49 phase into C54 which is low in electric resistance. As a result, $TiSi_2$ layers 51 of the C54 phase are formed on the polysilicon layers 31 and 33, the N-channel diffusion domains 39, and the P-channel diffusion domains 43, respectively.

Figure 6:
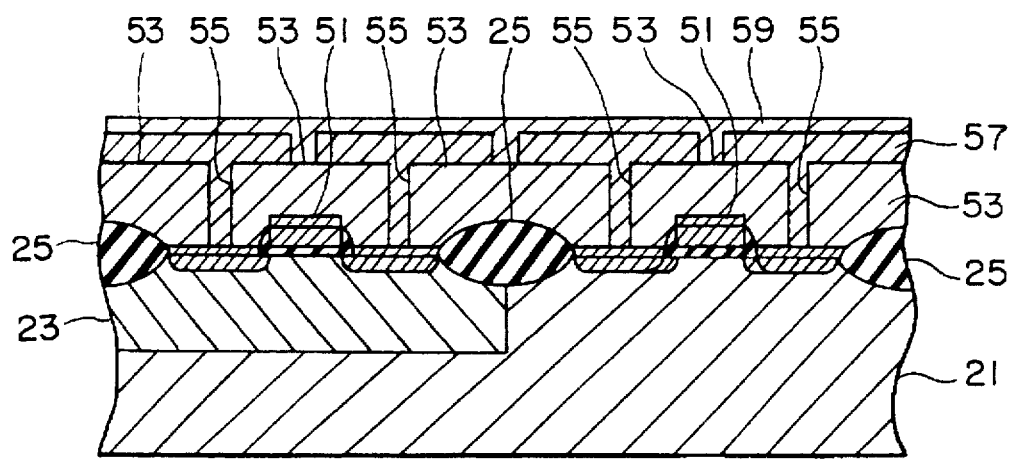

Referring to FIG. 6, silicon dioxide layer 53 is, thereafter, formed to overlie the entire surface, and then contact holes 55 are formed in the silicon dioxide layer 53. Then, metal wiring 57, such as aluminium film, is made on the silicon dioxide layer 53 through the contact holes 55. Finally, a protection film 59 is formed to complete the CMOS device.

Figure 7:
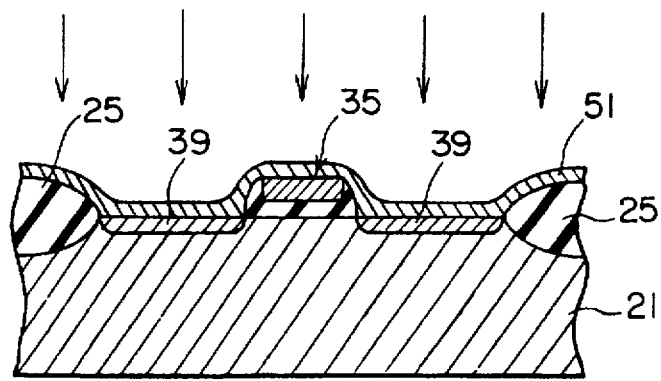
FIG. 7 is a cross sectional view for use in explanation of another known method of manufacturing a semiconductor device.

Referring to FIG. 7, the modified method which is disclosed in JP-A-1 179415 is described below.

After forming field oxide film portions 25 and gate structure 35 on the silicon substrate 21, a titanium film 41 is formed with a thickness of 500 angstroms by a sputtering process on an upper surface defined by the field oxide film portions 25, the diffusion domains 39, and the gate electrodes 35. Thereafter, silicon ions are implanted into the diffusion domains 39 through the titanium film 41 to convert the silicon of the surface domains 39 into amorphous silicon layers.

Thereafter, a chemical reaction heat treatment is performed in an atmosphere of nitrogen at 700° C. for 60 seconds by a lamp annealing equipment to react the titanium with silicon, so that $TiSi_2$ layer of C49 phase is formed. Thereafter, an etching is carried out to remove excessive portions of titanium layer and titanium in the similar manner as in FIG. 5. Thereafter, a phase transition heat treatment as a heat treatment is carried out in an atmosphere of argon at 800° C. for 30 seconds to convert $TiSi_2$ from C49 phase into C54 phase.

Those methods known in the prior art have problems as described previously.

Now, referring to FIGS. 8–11, description will be made as regards a method of fabricating a CMOS according to one embodiment of the present invention.

Figure 8:
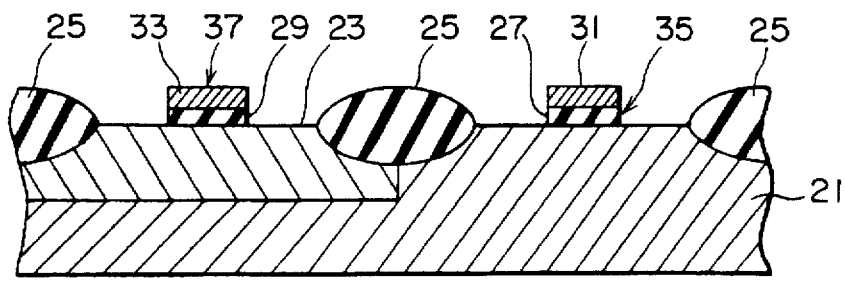
FIGS. 8 to 11 are cross-sectional views for use in explanation of processes of manufacturing a semiconductor device according to one embodiment of the present invention.
Figure 9:
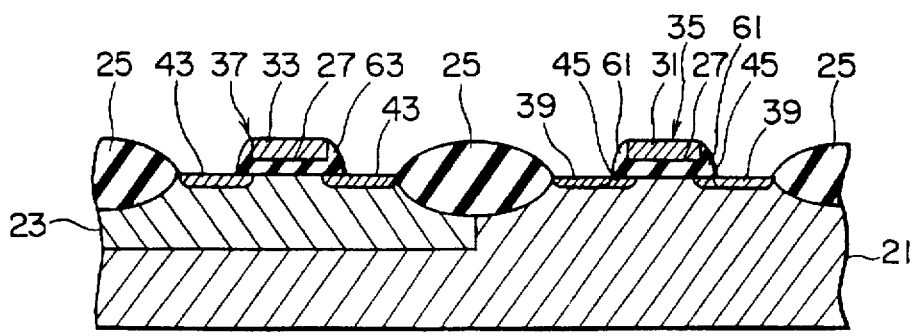
Figure 10:
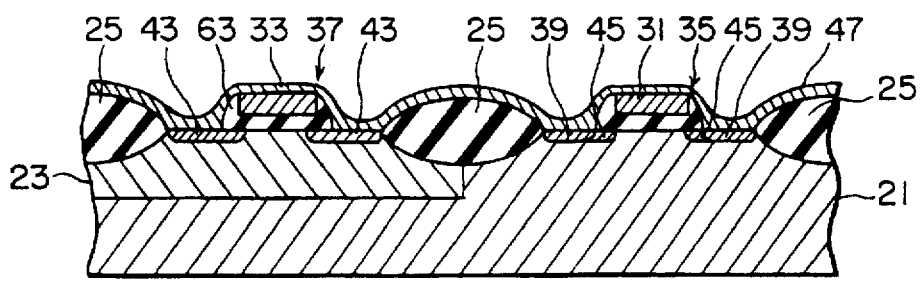

Processes shown in FIGS. 8–10 are similar to processes shown in FIGS. 1–14 before performing the first heat-treatment. The similar portions are represented by the same reference numerals and are not again described for the purpose of simplification.

Referring to FIG. 10, after the titanium film 47 is deposited with a thickness of 400 angstroms in a similar manner as in FIG. 4 in the prior art, a chemical reaction heat treatment is carried out in an atmosphere of nitrogen at a temperature about 400° C. or less for about 30 minutes by use of lamp annealing equipment to form the titanium silicide. The titanium silicide is amorphous.

The amorphous titanium silicide is formed by reaction heat-treatment at a temperature within a range of about 200° C. to 400° C. The heat treatment at a temperature higher than about 400° C. makes $TiSi_2$ of C49 phase, but heat treatment at a temperature less than 200° C. cannot produce the amorphous phase.

The maximum temperature for making the amorphous silicide may rise in reverse proportion to a thickness of titanium silicide film. The heat treatment at 200° C. for 30 minutes makes the amorphous layer up to a thickness of 150 angstroms. On the other hand, the heat treatment at 400° C. for 30 minutes makes an amorphous layer to a thickness of 300 angstroms.

Figure 11:
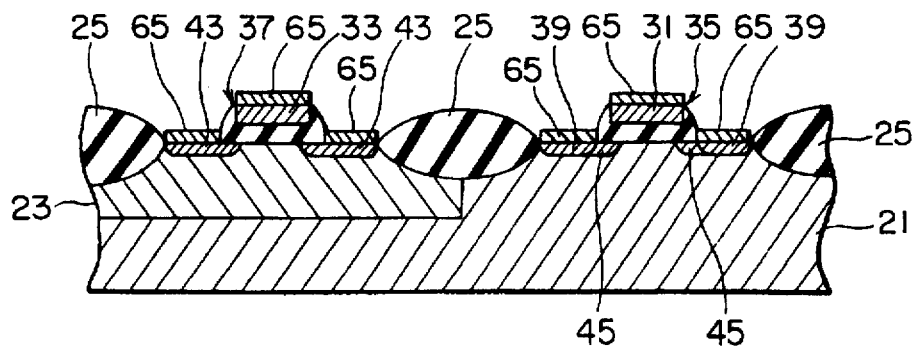

Thereafter, as shown in FIG. 11, the etching is carried out by use of ammonium hydrogen peroxide solution to remove non-reacted titanium film portions and the TiN layers. Thereafter, the phase transition heat treatment is carried out at about 800° C. for 10 seconds to convert $TiSi_2$ layers 65 from the amorphous state into the C54 phase which are formed selectively on both channel diffusion layer domains 39 and 43 and both polysilicon layers 31 and 33.

According to the method of the present invention, titanium silicide of amorphous state contains nuclei for the phase transition to form the C54 phase so that the phase transition is easily caused at a relative lower temperature of 850° C., at which the full transition of the thin $TiSi_2$ film has not been caused in the prior art. Therefore, the phase transition is fully completely though the heat treatment even at a temperature of 850° C. As a result, the $TiSi_2$ layers are obtained with a sheet resistivity of 3 ohms per unit area.

Thereafter, in accordance with the conventional process as described in conjunction with FIG. 6, the insulating silicon dioxide layers 53, contact holes 55 and metal wirings 57 are formed to complete the production of the CMOS device.

Figure 12:
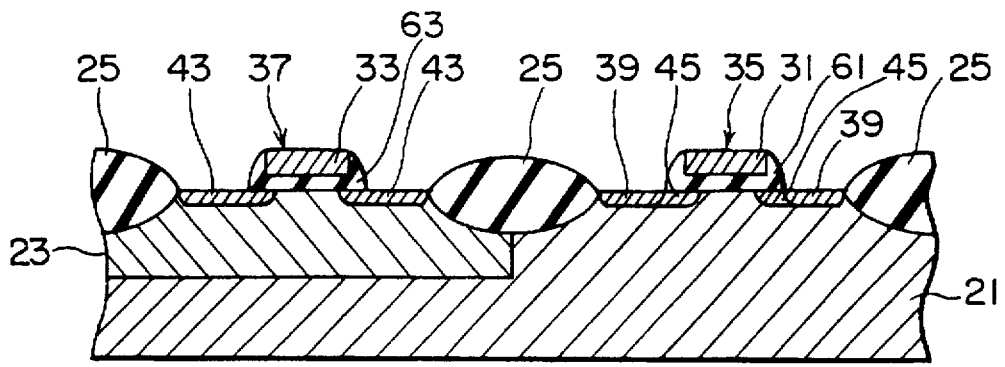
FIGS. 12 and 13 are cross sectional views for use in explanation of processes of manufacturing a semiconductor device according to a second embodiment of the present invention.
Figure 13:
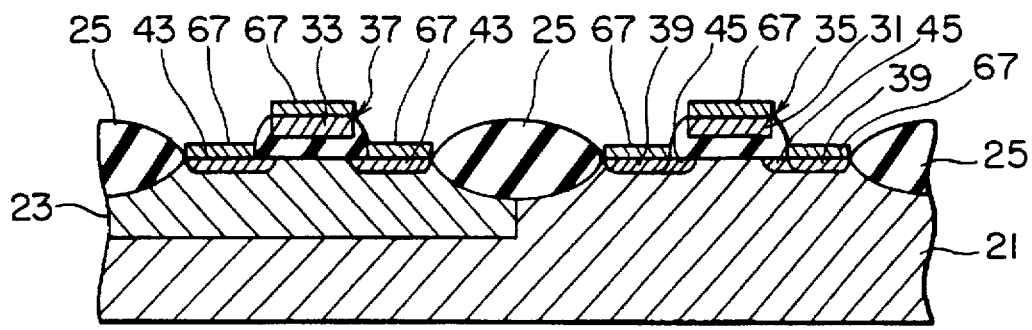

Referring to FIGS. 12 and 13, a second embodiment will be described, below.

Referring to FIG. 12, the shown substrate 21 is similar to a state shown in FIG. 3 and FIG. 9 after the impurity diffusion has been completed.

Referring to FIG. 13, amorphous $TiSi_x$ (x being more than 2) layers 67 are formed onto diffused domains 39 and 43 and polysilicon layers 31 and 33 by sputtering method with a thickness of 100 angstroms. Successively, the phase transition heat treatment is carried out at 850° C. for about 10 seconds in an atmosphere of nitrogen by use of a lamp annealing equipment to convert that $TiSi_2$ layers 67 into C54 phase.

In this embodiment, the amorphous silicide has the nuclei for the phase transition to C54 phase, so that the phase transition is fully completed even at a relatively low temperature of 850° C.

In the case that x is more than 2, the sputtered silicide is Si rich. Therefore, it is suppressed silicon that diffuses into the titanium silicide from the impurity diffused silicon regions and the polysilicon layers when the heat treatment is carried out to convert the silicide into the C54 phase. Accordingly, formation of voids is prevented in the silicon substrate 21 and the polysilicon 31.

As mentioned above, according to Examples 1 and 2, because the processes need not be carried out to generate the phase transition of the C49 to C54 phases, but to directly from the amorphous phase to the C54 phase, the rise of the temperature during phase transition can be restrained.

Now, third embodiment will be described with reference to FIGS. 14–16.

Figure 14:
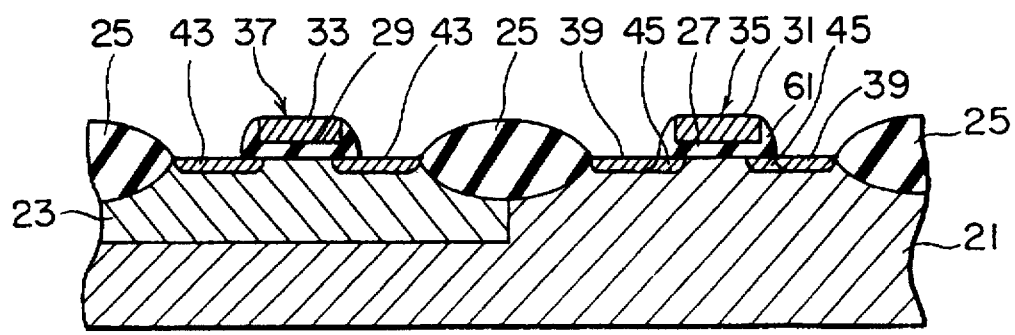
FIGS. 14 to 16 are cross sectional views for use in explanation of processes of manufacturing a semiconductor device according to a third embodiment of the present invention.

Referring to FIG. 14, the shown substrate 21 is a state similar to ones shown in FIGS. 3, 9 and 12.

Figure 15:
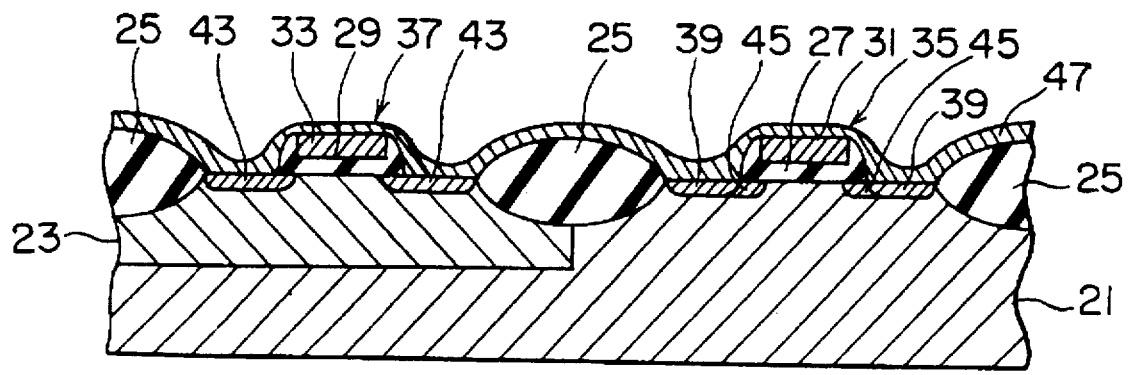

Referring to FIG. 15, titanium film 47 is deposited onto the entire surface of the state in FIG. 14 by a sputtering process in a similar manner as in the prior art. The titanium film 47 has a thickness of about 100 angstroms. Thereafter, the chemical reaction heat treatment is performed at 650° C. for 60 seconds by use of the lamp annealing equipment to convert the titanium film 47 into $TiSi_2$ film of the C49 phase in a similar manner as in the prior art.

The chemical reaction for making C49 phase takes place by the reaction heat-treatment at a temperature within the range of about 400° to 750° C. However, the minimum temperature may rise in reversed proportion to a thickness of the titanium film.

Figure 16:
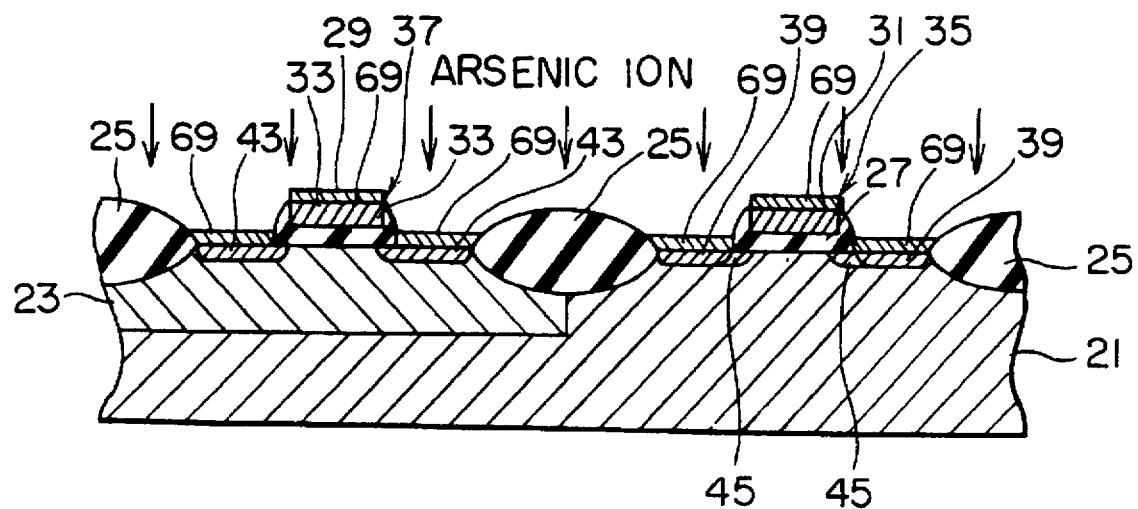

As shown in FIG. 16, the etching is then carried out by ammonium hydrogen peroxide solution to remove non-reacted Ti portions and TiN portions. Thus, $TiSi_2$ layers 69 remain on the diffused regions 39 and 43, and the polysilicon layers 31 and 33.

Thereafter, ion-implantation is performed to the $TiSi_2$ layers 69 so as to make the titanium silicide of C49 phase convert into amorphous state or another state having damage in the lattice of C49 phase.

In detail, some atoms of titanium or silicon forming lattices of the C49 phase are attacked by ions implanted and are dispersed by collisions. Thereby, the lattices of titanium silicide have defects and a random structure which does not form a regular C49 phase structure. Therefore, the lattice has nuclei for the phase transition from C49 phase into C54 phase. Therefore, this structure of the titanium silicide will be called an amorphous state or a damaged state.

Successively, a phase transition heat treatment is carried out in an atmosphere of nitrogen at 850° C. for 30 seconds to convert the titanium silicide layers having the amorphous state or damaged state into C54 phase. The phase transition is fully completed by the heat treatment even at a relative lower temperature of 850° C.

Thereafter, the CMOS device is completed in the similar manner as shown in FIG. 6.

In the third embodiment, when the silicide layer of the refractory metal, such as $TiSi_2$, become thinner, the rise of the temperature in the phase transition from C49 phase to C54 phase can be suppressed by the amorphous state of the $TiSi_2$ layer or the damaged C49 phase of the $TiSi_2$ layer. Therefore, there is provided a method for manufacturing a semiconductor device with the low electric resistance layers of the C54 phase without agglomeration of $TiSi_2$ grains of the C49 phase.

As a silicide of refractory metal, titanium silicide was used in the above-mentioned embodiments, but the titanium silicide may be substituted by silicide of another refractory metal, such as Ni, Mo, W, Co, Pt, or Ta.

While this invention has thus far been described in conjunction with particular embodiments, it will readily be made for those skilled in the art to put this invention into practice in various other manners.

What is claimed is:

1. A method for manufacturing a semiconductor device having a process of forming a silicide layer having relatively low electric resistance with a sheet resistance of less than or equal to about 3 ohms per unit area on a surface of a silicon layer, said process comprising steps of:

depositing a film of refractory metal on the surface of the silicon layer;

subjecting said deposited film to a chemical reaction heat treatment at a reaction temperature to convert said film into a layer of amorphous silicide of refractory metal therein, said amorphous silicide having a high electrical resistance relative to said silicide layer having relatively low electric resistance; and subjecting said layer of amorphous silicide to a phase transition heat treatment at a transition temperature higher than said chemical reaction temperature to convert said layer of amorphous silicide into said silicide layer having relatively low electric resistance.

2. The method as claimed in claim 1, wherein said chemical reaction heat treatment is performed in a nitrogen atmosphere and then unreacted refractory metal and refractory metal nitride are removed.

3. The method as claimed in claim 2, wherein said reaction temperature is 400° C. or less.

4. The method as claimed in claim 3, wherein said reaction temperature is 200° C. or more.

5. The method as claimed in claim 2, wherein said silicon layer is a polycrystalline silicon layer formed, as a gate electrode, on a silicon substrate.

6. The method as claimed in claim 5, wherein said transition temperature is 900° C. or less.

7. The method as claimed in claim 6, wherein said transition temperature is 800° C. or more.

8. The method as claimed in claim 6, wherein said refractory metal is Ti, and said amorphous silicide is $TiSi_2$.

9. The method as claimed in claim 8, wherein said amorphous silicide is converted into C54 phase, as said silicide layer having relatively low electric resistance, by said phase transition heat treatment.

10. The method as claimed in claim 2, wherein said refractory metal is at least one element selected from the group consisting of Ti, Co, Pt, Ni, Mo, W, and Ta.

11. The method as claimed in claim 2, wherein said silicon layer is a single crystalline silicon layer of a channel diffusion domain selected from the group consisting of source and drain regions formed in a silicon substrate.

12. A method for manufacturing a semiconductor device having a process of forming a crystalline silicide layer having relatively low electric resistance with a sheet resistance of less than or equal to about 3 ohms per unit area on a surface of a silicon layer, said process comprising steps of:

depositing directly on the surface of said silicon layer of amorphous silicide of refractory metal, said layer of amorphous silicide of refractory metal having a formula $TiSi_x$, where x is a number of 2 or more, and having a high electric resistance relative to said crystalline silicide layer, and subjecting said layer of amorphous silicide to a phase transition temperature at a transition temperature to convert said layer of amorphous silicide into said crystalline silicide layer having relatively low electric resistance wherein said amorphous silicide is converted into C54 phase, as said crystalline silicide layer having relatively low electric resistance, by said phase transition heat treatment.

13. The method as claimed in claim 12, wherein said transition temperature is 900° C. or less.

14. The method as claimed in claim 13, wherein said transition temperature is 800° C. or more.

15. The method as claimed in claim 12, wherein said silicon layer is a polycrystalline silicon layer formed, as a gate electrode, on a silicon substrate.

16. A method for manufacturing a semiconductor device having a process of forming a crystalline silicide layer having relatively low electric resistance with a sheet resistance of less than or equal to about 3 ohms per unit area on a surface of a silicon layer, said processing comprising steps of:

depositing a film of refractory metal on the surface of the silicon layer;

subjecting said deposited film to a chemical reaction heat treatment at a reaction temperature to convert said film into a layer of silicide of refractory metal, said layer of silicide of refractory metal being a crystalline silicide layer having a relatively high electric resistance relative to said crystalline silicide layer having relatively low electric resistance;

ion-implanting into said layer of silicide of refractory metal to generate damage therein, said damage being phase transition nuclei in at least one state selected from the group consisting of lattice vacancies and interstitials; and subjecting the layer of ion-implanted silicide to a phase transition treatment at a transition temperature higher than said chemical reaction temperature to convert said ion-implanted silicide layer into said crystalline silicide layer having relatively low electric resistance.

17. The method as claimed in claim 16, wherein said chemical reaction treatment is performed in a nitrogen atmosphere, and then the unreacted refractory metal and refractory metal nitride being removed.

18. The method as claimed in claim 17, wherein said reaction temperature is greater than or equal to 400° C. and less than or equal to 750° C.

19. The method as claimed in claim 17, wherein said transition temperature is 900° C. or less.

20. The method as claimed in claim 19, wherein said transition temperature is 800° C. or more.

21. The method as claimed in claim 17, wherein said refractory metal is at least one element selected from the group consisting of Ti, Co, Pt, Ni, Mo, W, and Ta.

22. The method as claimed in claim 21, wherein said refractory metal is Ti, and said crystalline silicide layer having relatively high electric resistance is $TiSi_2$ of C49 phase.

23. The method as claimed in claim 22, wherein said crystalline silicide of C49 phase with said damage is converted into C54 phase, as said crystalline silicide layer having relatively low electric resistance, by said phase transition heat treatment.

24. The method as claimed in claim 12, wherein said silicon layer is a single crystalline silicon layer of a channel diffusion domain selected from the group consisting of source and drain regions formed in a silicon substrate.

25. The method as claimed in claim 16, wherein said silicon layer is a polycrystalline silicon layer formed, as a gate electrode, on a silicon substrate.

26. The method as claimed in claim 16, wherein said silicon layer is single crystalline silicon of a channel diffusion domain selected from the group consisting of source and drain regions formed in a silicon substrate.

* * * * *